(12) United States Patent
Albrecht et al.

(10) Patent No.: US 8,252,153 B2
(45) Date of Patent: Aug. 28, 2012

(54) PATTERNED-MEDIA PERPENDICULAR MAGNETIC RECORDING DISK WITH SERVO REGIONS HAVING MAGNETIZED SERVO PILLARS AND OPPOSITELY-MAGNETIZED SERVO TRENCHES

(75) Inventors: Thomas R Albrecht, San Jose, CA (US); Zvonimir Z. Bandic, San Jose, CA (US); Olav Hellwig, San Jose, CA (US); Gabriel Zeltzer, Redwood City, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 13/103,143

(22) Filed: May 9, 2011

(65) Prior Publication Data
US 2011/0212347 A1    Sep. 1, 2011

Related U.S. Application Data

(62) Division of application No. 12/412,548, filed on Mar. 27, 2009, now Pat. No. 7,960,044.

(51) Int. Cl.
*C23C 14/00* (2006.01)
*C23C 14/32* (2006.01)

(52) U.S. Cl. .................. 204/192.2; 427/502

(58) Field of Classification Search ............. 204/192.2; 427/502
See application file for complete search history.

(56) References Cited

U.S. PATENT DOCUMENTS

| | | | |
|---|---|---|---|
| 5,650,987 A * | 7/1997 | Kadowaki | 369/44.34 |
| 6,153,281 A | 11/2000 | Meyer et al. | |
| 6,791,774 B1 * | 9/2004 | Albrecht et al. | 360/17 |
| 6,999,279 B2 | 2/2006 | Lundstrom | |
| 7,164,548 B2 | 1/2007 | Hattori et al. | |

(Continued)

FOREIGN PATENT DOCUMENTS

JP    2001084580    3/2001

OTHER PUBLICATIONS

K. Watanabe, T. Takeda, K. Okada and H. Takino, "Demonstration of track following technique based on discrete track media," IEEE Trans. Magn, vol. 29, No. 6, pp. 4030-4032, 1993.

(Continued)

*Primary Examiner* — Luan Van
*Assistant Examiner* — Ibrahime A Abraham
(74) *Attorney, Agent, or Firm* — Thomas R. Berthold

(57) ABSTRACT

A patterned perpendicular magnetic recording disk has a pre-patterned disk substrate with pillars and trenches arranged in data regions and servo regions. In the data regions, the height of the data pillars is equal to or greater than the spacing between the data pillars, while in the servo regions the height of the servo pillars is less than the spacing between the servo pillars. A magnetic recording material with perpendicular magnetic anisotropy is deposited over the entire disk substrate, which results in magnetic material on the tops of the data pillars and servo pillars and in the servo trenches. The material in the data trenches is either nonmagnetic or discontinuous. After the application of a high DC magnetic field in one perpendicular direction and a low DC magnetic field in the opposite direction, the resulting disk has patterned servo sectors with servo pillars all magnetized in the same perpendicular direction and servo trenches magnetized in the opposite perpendicular direction.

5 Claims, 8 Drawing Sheets

U.S. PATENT DOCUMENTS

| | | | |
|---|---|---|---|
| 7,754,354 B2 | 7/2010 | Lee et al. | |
| 2006/0279871 A1 | 12/2006 | Albrecht et al. | |
| 2007/0159721 A1 | 7/2007 | Honda et al. | |
| 2007/0172704 A1* | 7/2007 | Lee et al. | 428/826 |
| 2009/0042112 A1 | 2/2009 | Sugimura et al. | |

OTHER PUBLICATIONS

T. Takeda and K. Watanabe, "A study on pre-embossed rigid magnetic disk," IEICE Trans. on Electronics, vol. E77-C, No. 9, pp. 1507-1513, 1994.

Moritz et al. in "Patterned Media Made From Pre-Etched Wafers: A Promising Route Toward Ultrahigh-Density Magnetic Recording", IEEE Transactions on Magnetics, vol. 38, No. 4, Jul. 2002, pp. 1731-1736.

G. Hu, et al., "Magnetic and recording properties of Co/Pd islands on prepatterned substrates", J. Appl. Phys., vol. 95, No. 11, Part 2, Jun. 1, 2004, pp. 7013-7015.

Bandic et al., "Patterned magnetic media: impact of nanoscale patterning on hard disk drives", Solid State Technology S7+ Suppl. S, Sep. 2006.

* cited by examiner

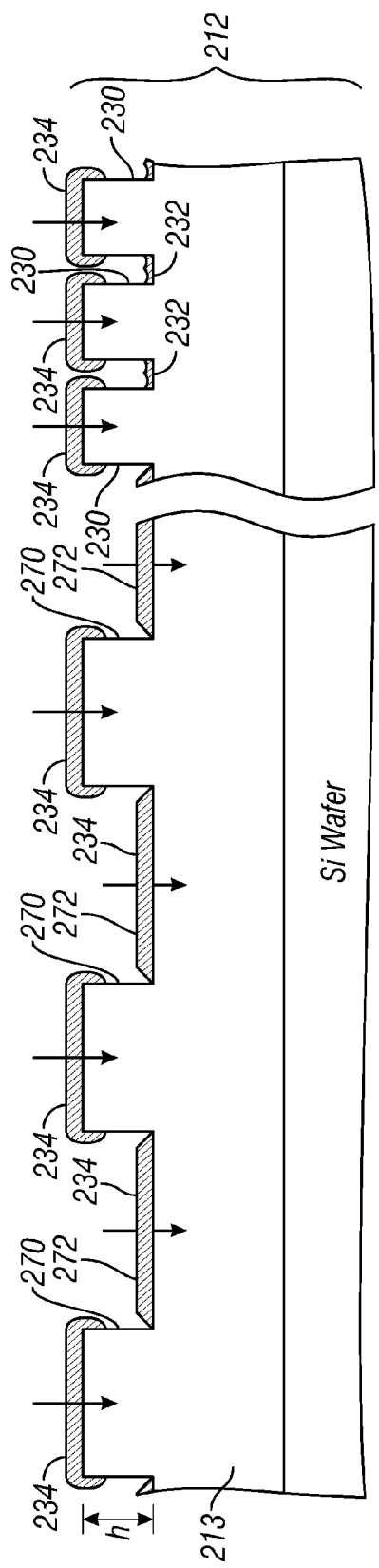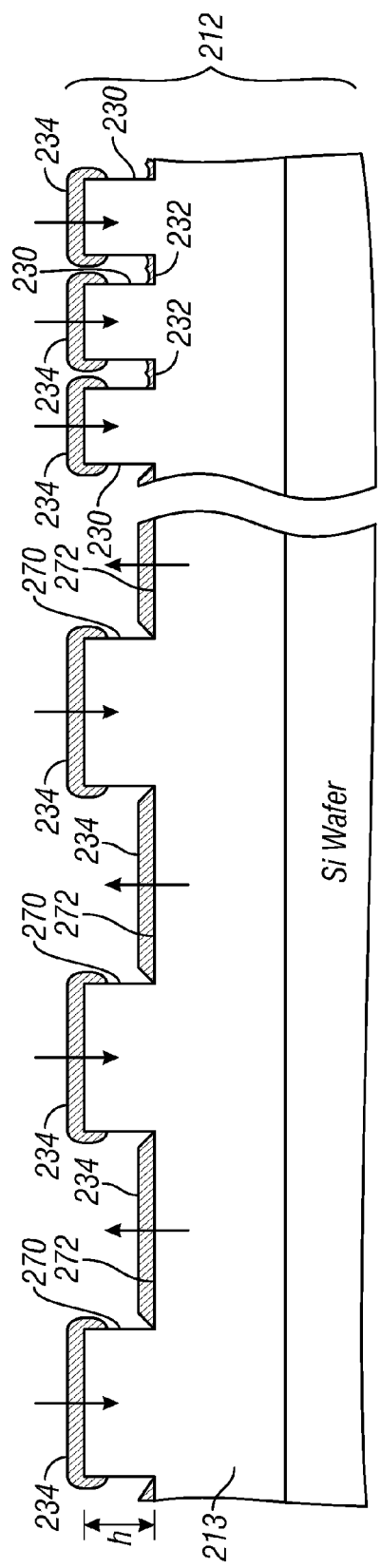
FIG. 6C
FIG. 6D

PATTERNED-MEDIA PERPENDICULAR MAGNETIC RECORDING DISK WITH SERVO REGIONS HAVING MAGNETIZED SERVO PILLARS AND OPPOSITELY-MAGNETIZED SERVO TRENCHES

RELATED APPLICATION

This application is a divisional of application Ser. No. 12/412,548, filed Mar. 27, 2009, which is now U.S. Pat. No. 7,960,044 B2.

BACKGROUND OF THE INVENTION

1. Field of the Invention

This invention relates generally to patterned perpendicular magnetic recording media, such as disks for use in magnetic recording hard disk drives (HDDs), and more particularly to patterned-media disks wherein the data bits are stored on elevated magnetic data islands or pillars isolated from one another by recessed trenches.

2. Description of the Related Art

Magnetic recording hard disk drives with patterned magnetic recording media have been proposed to increase data density. In patterned media the magnetic recording layer on the disk is patterned into small isolated data islands arranged in concentric data tracks such that there is a single magnetic domain in each island or "bit". The single magnetic domain can be a single grain or consist of a few strongly coupled grains that switch magnetic states in concert as a single magnetic volume. This is in contrast to conventional continuous media wherein a single "bit" may have multiple weakly coupled magnetic grains separated by grain boundaries. Patterned-media disks may be perpendicular magnetic recording disks, wherein the magnetization directions are perpendicular to or out-of-the-plane of the recording layer. In one type of patterned media, the data islands are elevated, spaced-apart pillars that extend above the disk substrate surface to define troughs or trenches on the substrate surface between the pillars. This type of patterned media is of interest because substrates with the pre-etched pattern of pillars and trenches can be produced with simpler fabrication processes which avoid etching of the magnetic recording layer material. The magnetic recording layer material is then deposited over the entire surface of the pre-etched substrate to cover both the ends of the pillars and the trenches. It was believed that because the trenches were recessed they would be far enough from the read/write head to not adversely affect reading or writing. This type of patterned media is described by Moritz et al. in "Patterned Media Made From Pre-Etched Wafers: A Promising Route Toward Ultrahigh-Density Magnetic Recording", *IEEE Transactions on Magnetics*, Vol. 38, No. 4, July 2002, pp. 1731-1736. This type of patterned media with perpendicular magnetization on the pillar ends provides opportunity for ultra-high density magnetic recording.

Like conventional non-patterned or continuous-media disks, patterned-media disks also have nondata servo regions that are used for read/write head positioning. The servo regions in the pre-etched type of patterned-media disks with elevated spaced-apart data pillars are also patterned and thus contain elevated nondata servo islands or pillars that are separated by trenches. The servo pillars are "servowritten" or pre-magnetized during the manufacturing process and are not intended to be rewritten during normal operation of the HDD. The proposed method for servowriting this type of disk is to DC "erase" the disk during manufacturing with a large magnet, leaving all of the servo pillars magnetized in the same direction. Thus for a patterned-media perpendicular magnetic recording disk, all of the servo pillars have the same magnetization direction, i.e., either "into" or "out of" the surface of the disk. Because only a single polarity of magnetization is used, half of the available signal amplitude from the servo pillars is sacrificed and thus the signal-to-noise ratio (SNR) of the servo signal is less than optimum.

What is needed is a patterned-media perpendicular magnetic recording disk with patterned nondata servo regions that provide a servo signal with improved SNR.

SUMMARY OF THE INVENTION

The invention relates to a patterned perpendicular magnetic recording medium, like a perpendicular magnetic recording disk, of the type that has spaced-apart pillars with magnetic material on their ends and with trenches between the pillars, and to a method for making the medium. A pre-etched or pre-patterned disk substrate has pillars and trenches arranged in data regions and servo regions. In the data regions, the height of the data pillars is equal to or greater than the spacing between the data pillars, while in the servo regions the height of the servo pillars is less than the spacing between the servo pillars. A magnetic recording material with perpendicular magnetic anisotropy is deposited over the entire disk substrate, typically by sputter deposition. This results in the magnetic material being deposited on the tops of the data pillars and servo pillars and in the servo trenches. However, in the data trenches the material is not fully deposited so that in the data trenches the material is either essentially nonmagnetic or is magnetically discontinuous. This is because of the ratio of the data pillar height to the data pillar spacing, which creates a shadowing effect from the sidewalls of the data pillars during the sputter deposition of the magnetic material.

The magnetic material is a multilayer of alternating very thin films, like Co/Pt, or a binary alloy, like $Co_{50}Pt_{50}$, that is preferably chemically-ordered, or a pseudo-binary alloy, like $(Co_{50}Pt_{50})$—X, where the element X may be Ni, Au, Cu, Pd or Ag.

The entire disk is then subjected to a high DC magnetic field. This results in the servo pillars, data pillars and servo trenches all being magnetized in the same direction. If the data trenches contain nonmagnetic material, the data trenches will not be magnetized. If the data trenches contain discontinuous magnetic material, but in a significantly reduced amount from what is formed in the servo trenches, this material will also be magnetized in the same direction as the servo pillars, data pillars and servo trenches when exposed to this high DC field.

The entire disk is then subjected to a low DC magnetic field applied in the opposite direction of the first DC field. This causes magnetization reversal in the servo trenches but no magnetization reversal on the servo pillars or data pillars or in the data trenches. This is because the magnetic material in the servo trenches is made up of small microcrystalline grains, with multiple adjacent grains forming magnetic domains. The materials in the individual domains are highly magnetically exchange coupled. As a result of the relatively large surface area of the servo trenches, different portions or volumes of the magnetic material will have different anisotropy fields. Thus, when an external field is applied nucleation can occur at a relatively low field on some volumes that have low anisotropy field. When the magnetization of these few volumes switches at a relatively low field, they will cause the remaining volumes in the servo trenches to also switch by domain wall motion because the materials in the servo trenches are magnetically highly exchange coupled. However, on the servo pillars and data pillars the domain walls cannot exceed the edge of each pillar. Thus, while the magnetization of the servo trenches switches with the application of this second low DC magnetic field, the magnetization of the servo pillars and data pillars is not switched. If the data trenches contain discontinuous magnetic material, but in a significantly reduced amount from what is formed in the servo trenches, this material will not have its magnetization switched when exposed to the low DC field because this discontinuous magnetic material has a very high coercivity. Also, any discontinuous magnetic material in the data trenches will not affect operation of the HDD because as a result of its very high coercivity it cannot be rewritten when the write head is writing to the data pillars since the magnetic write field is not large enough at the increased distance of the data trenches.

As a result of the method of making the disk according to this invention, the disk has patterned servo sectors with servo pillars all magnetized in the same perpendicular direction and servo trenches magnetized in the opposite perpendicular direction. If the servo pillars repeat with a certain period and the servo pillars and servo trenches are magnetized in opposite directions, then the servo signal detected by the read head will be a series of pulses with peak-to-peak amplitude substantially greater than the peak-to-peak amplitude if the servo trenches were not magnetized.

For a fuller understanding of the nature and advantages of the present invention, reference should be made to the following detailed description taken together with the accompanying figures.

BRIEF DESCRIPTION OF THE DRAWING

FIGS. 6A-6D are sectional views of a disk according to this invention at various stages of the disk manufacturing process.

DETAILED DESCRIPTION OF THE INVENTION

Figure 1:
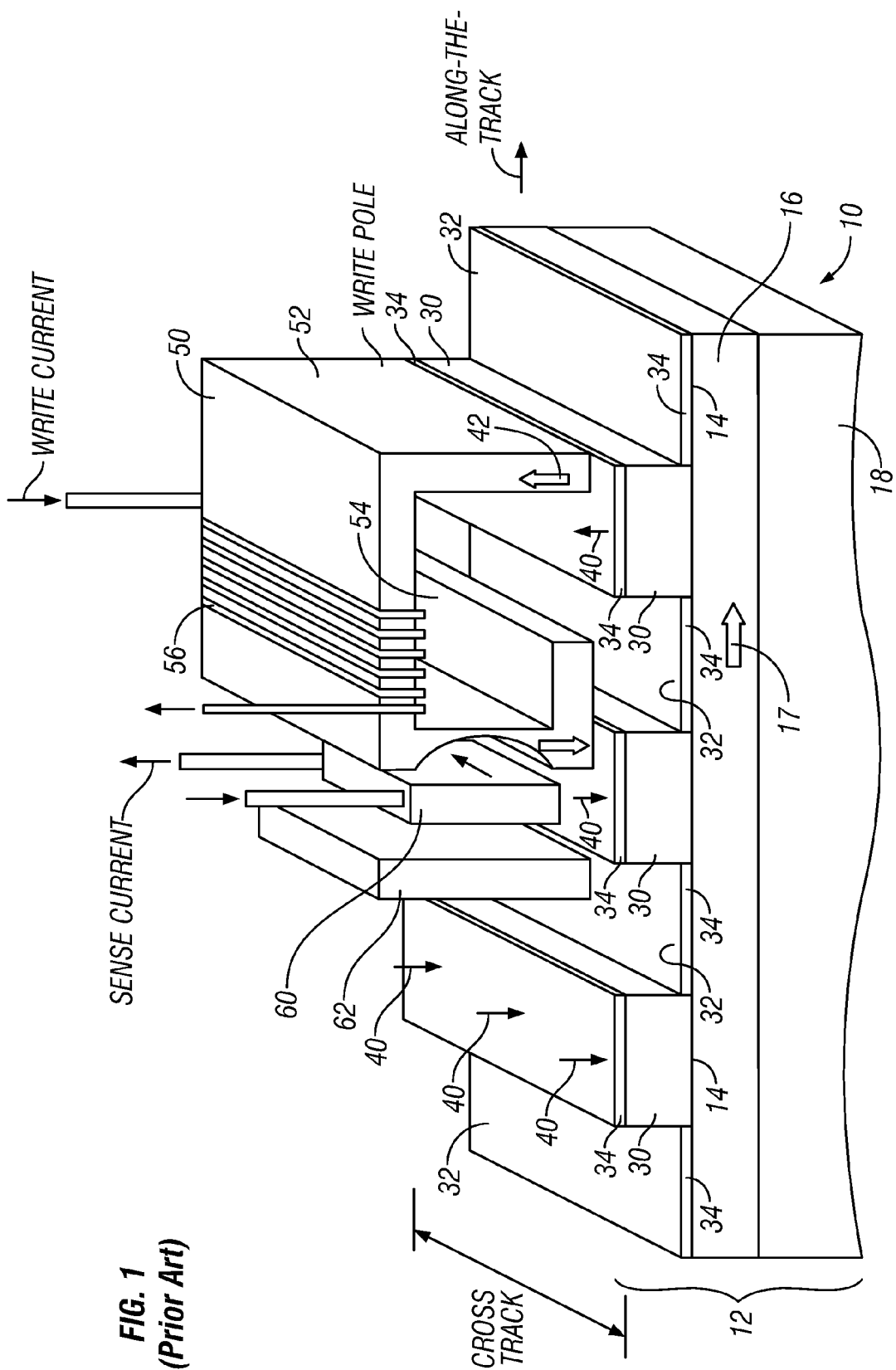
FIG. 1 is a schematic representation of a perpendicular magnetic recording system with a prior art patterned perpendicular medium.

FIG. 1 is a schematic representation of a prior art perpendicular magnetic recording system with patterned perpendicular media. The system can be implemented in a magnetic recording disk drive, with the medium being a magnetic recording disk with the patterned bits arranged into concentric circular data tracks. FIG. 1 thus shows a portion of a disk 10 that includes a substrate 12 with a generally planar surface 14. A plurality of discrete patterned islands or pillars 30 extend generally perpendicularly from the surface 14 and are part of substrate 12. The pillars 30 are spaced apart, leaving troughs or trenches 32 recessed below the ends of the pillars 30. Because the pillars 30 and trenches 32 are along a data track in a data region of disk 10, they will be referred to as data pillars and data trenches, respectively. A layer 34 of perpendicular magnetic recording material is formed on the ends of the data pillars 30 as well as on surface 14 in the data trenches 32. The recording layer 34 on each of the data pillars 30 is magnetized perpendicularly, as depicted by arrows 40, resulting in the recorded bits being stored in the recording layer 34 in a generally perpendicular or out-of-plane orientation (i.e., other than parallel to the surface of the recording layer 34). In this type of patterned media, even though there is magnetic recording layer material in the data trenches between the spaced-apart data pillars, the perpendicular spacing between the trenches and the tops or ends of the pillars is the basis for isolating the recorded bits. However, as will be described below, the magnetic material in the trenches may still adversely affect reading and writing of the bits. As shown in FIG. 1, the substrate 12 may also include an optional "soft" or relatively low-coercivity magnetically permeable underlayer (SUL) 16 formed on a rigid disk support structure or base 18.

Also shown in the schematic of FIG. 1 is the read head 60 and the write head 50 (with write pole 52 and a return pole 54). Write current passes through a coil 56 of the write head 50 to generate a magnetic field (arrow 42) at the write pole 52. This magnetic field magnetizes the recording layer 34 on the pillar 30 beneath the write pole in the direction 40. The SUL 16 serves as a flux return path (arrow 17) for the magnetic field between the write pole 52 and the return pole 54 of the write head 50. The detection or reading of the recorded bits is by a read head 60, typically a magnetoresistive (MR) read head, such as a tunneling MR (TMR) read head in which a sense current passes perpendicularly through the layers making up the head. A shield 62 of magnetically permeable material may be used to prevent magnetizations from bits other than the bit being read from reaching the read head 60.

Figure 2:
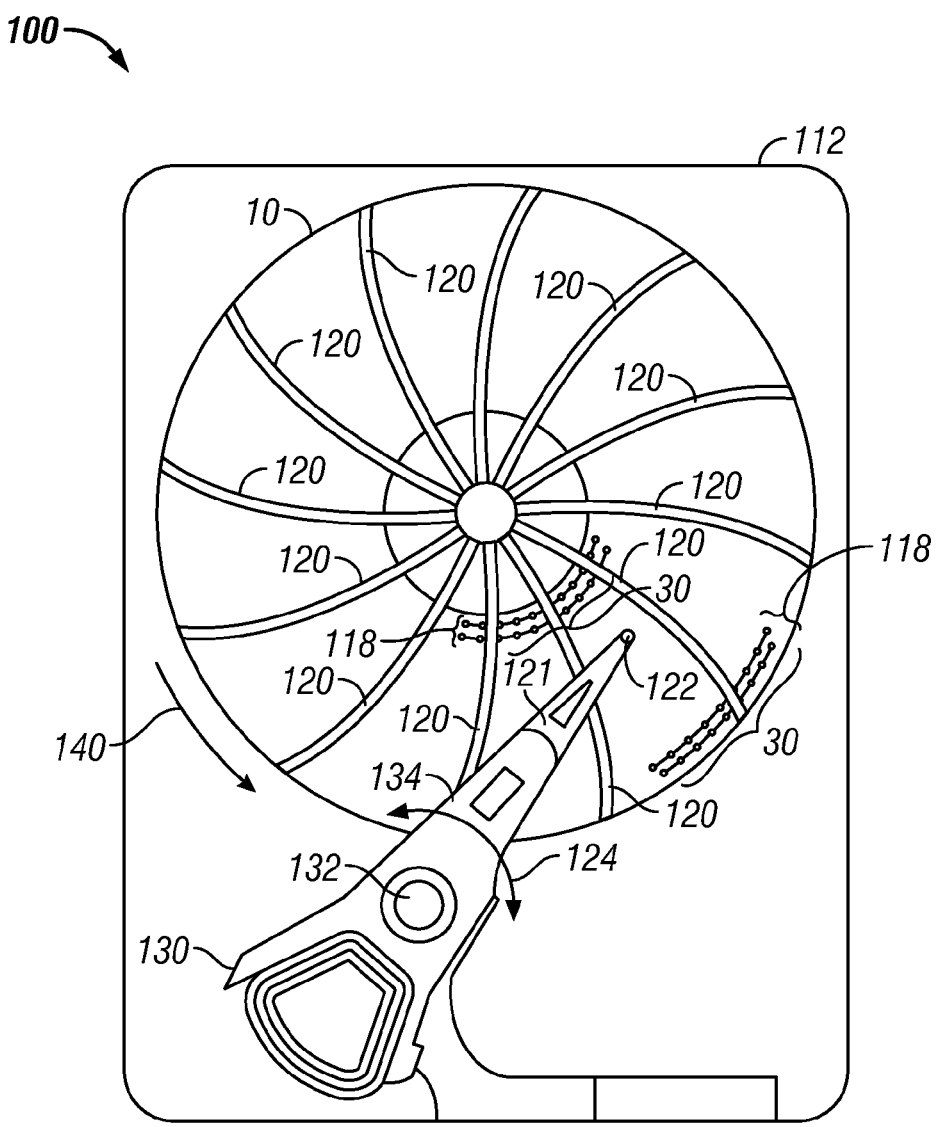
FIG. 2 is a top view of a disk drive implementation of the system illustrated in FIG. 1 and shows the patterned bits arranged in concentric circular data tracks.

FIG. 2 is a top view of a disk drive implementation of the system illustrated in FIG. 1. The drive 100 has a housing or base 112 that supports an actuator 130 and a drive motor for rotating the magnetic recording disk 10. The actuator 130 may be a voice coil motor (VCM) rotary actuator that has a rigid arm 134 and rotates about pivot 132 as shown by arrow 124. A head-suspension assembly includes a suspension 121 that has one end attached to the end of actuator arm 134 and a head carrier 122, such as an air-bearing slider, attached to the other end of suspension 121. The suspension 121 permits the head carrier 122 to be maintained very close to the surface of disk 10. The read head 60 (FIG. 1) and write head 50 (FIG. 1) are typically formed as an integrated read/write head (not shown) patterned on the trailing surface of the head carrier 122. The data pillars 30 on disk 10 are arranged in radially-spaced concentric circular data tracks 118. As the disk 10 rotates in the direction of arrow 140, the movement of actuator 130 allows the read/write head on the trailing end of head carrier 122 to access different data tracks 118 on disk 10. Each data track 118 also includes a plurality of circumferentially or angularly-spaced patterned servo sectors 120 that contain positioning information detectable by the read head for moving the read/write heads to desired data tracks and maintaining the heads on the data tracks. The servo sectors in each track are aligned circumferentially with the servo sectors in the other tracks so that they extend across the tracks in a generally radial direction, as represented by radially-directed servo sectors 120. The servo sectors 120 are nondata regions that contain servo islands or pillars separated by servo trenches. The servo pillars are typically "servowritten" during manufacturing or formatting of the disk, and are not intended to be re-written during normal operation of the disk drive.

In the perpendicular magnetic recording system with the patterned disk 10 as shown in FIG. 1, only the perpendicular magnetic recording layer 34 on the ends of the data pillars 30 contributes to the data readback signal, with each data pillar 30 representing one bit. The magnetic recording layer material that is located in the data trenches 32 does not significantly contribute to the signal, but can act as a noise source. In addition, the magnetic material in the data trenches may increase coupling of neighboring bits via direct exchange or indirectly via dipolar interactions, thus preventing or reducing the possibility of single-bit addressing during writing. The magnetic material in the data trenches may also have a domain structure that generates undesired stray fields which can cause uncontrolled switching of neighboring bits during writing. Thus even though the disk 10 can be fabricated with a relatively large perpendicular spacing between the ends of data pillars 30 and the data trenches 32, it is desirable to avoid magnetic material in the data trenches to achieve maximum signal-to-noise ratio (SNR) and optimal recording performance.

Figure 3:
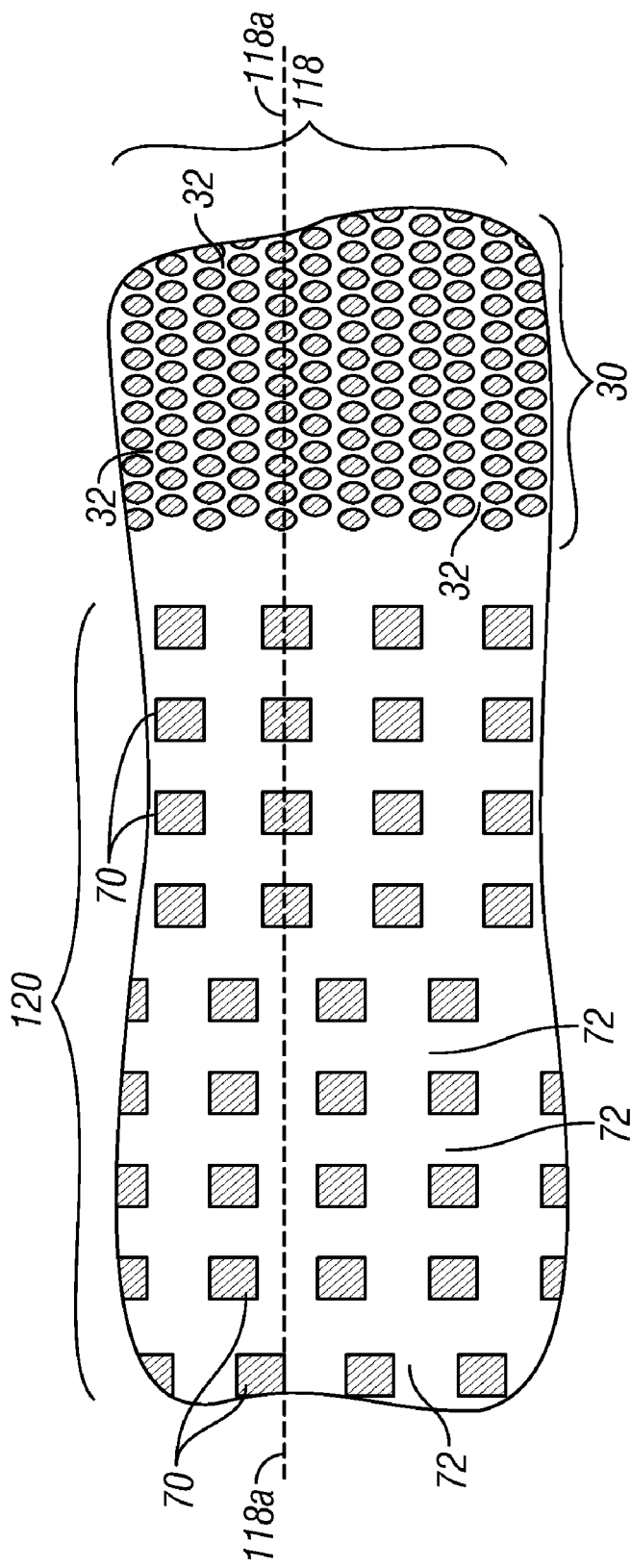
FIG. 3 is a top view of a patterned-media disk showing an enlarged portion of a servo sector adjacent to a portion of data tracks with data pillars and data trenches.

FIG. 3 is a top view of disk 10 showing an enlarged portion of a servo sector 120 adjacent to a portion of data tracks 118 with data pillars 30 and data trenches 32. The servo sector 120 includes servo pillars 70 that are spaced-apart to define servo trenches 72. The servo pillars 72 are arranged in a predetermined pattern, as is well known in the art. As the disk moves past the read head along the dashed line corresponding to the centerline of data track 118a, the pattern of servo pillars passing the read head generates a servo signal that is used to control the actuator 130 (FIG. 2) to maintain the read head or write head on the data track centerline 118a.

Figure 4A:
FIG. 4A is a representative signal from a single perpendicularly magnetized servo pillar.
Figure 4B:
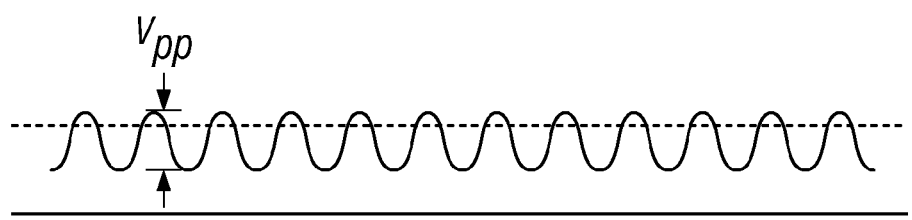
FIG. 4B is a representative servo signal from a series of servo pillars with all servo pillars DC-magnetized in the same perpendicular direction.

All of the servo pillars 70 are magnetized in the same perpendicular direction during a servowriting process, typically by applying a DC magnetic field from a large magnet. However, because the servo trenches 72 also contain magnetic material, the servo trenches can act as a noise source that undesirably contributes to the servo signal. FIG. 4A is representative of the servo signal detected by the read head as a single perpendicularly-magnetized servo pillar 70 of FIG. 3 passes the read head. The isolated pulse response $V_p$ shown is for a single perpendicularly-magnetized servo pillar. If the servo pillars repeat with a certain period, then because all servo pillars are DC-magnetized in the same perpendicular direction, the servo signal detected by the read head will be a series of pulses as shown in FIG. 4B. Note that the peak-to-peak amplitude $V_{pp}$ is smaller than the isolated pulse response $V_p$. However, because the servo trenches 72 between the servo pillars 70 may adversely contribute to the servo signal, the peak-to-peak amplitude $V_{pp}$ may be even smaller than as shown in FIG. 4B.

Figure 4C:
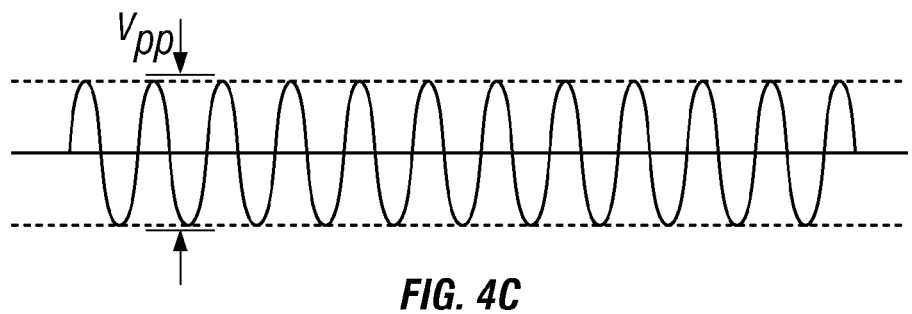
FIG. 4C is a representative servo signal according to this invention from a series of servo pillars with all servo pillars DC-magnetized in the same perpendicular direction and with the servo trenches between the servo pillars DC-magnetized in the opposite perpendicular direction.

As a result of the method of making the disk according to this invention, the disk has patterned servo sectors with servo pillars all magnetized in the same perpendicular direction and servo trenches magnetized in the opposite perpendicular direction. If the servo pillars repeat with a certain period and the servo pillars and servo trenches are magnetized in opposite directions, then the servo signal detected by the read head will be a series of pulses as shown in FIG. 4C. Note that the peak-to-peak amplitude $V_{pp}$ in FIG. 4C is substantially greater than the peak-to-peak amplitude $V_{pp}$ in FIG. 4B and thus the servo signal is significantly improved.

Figure 5:
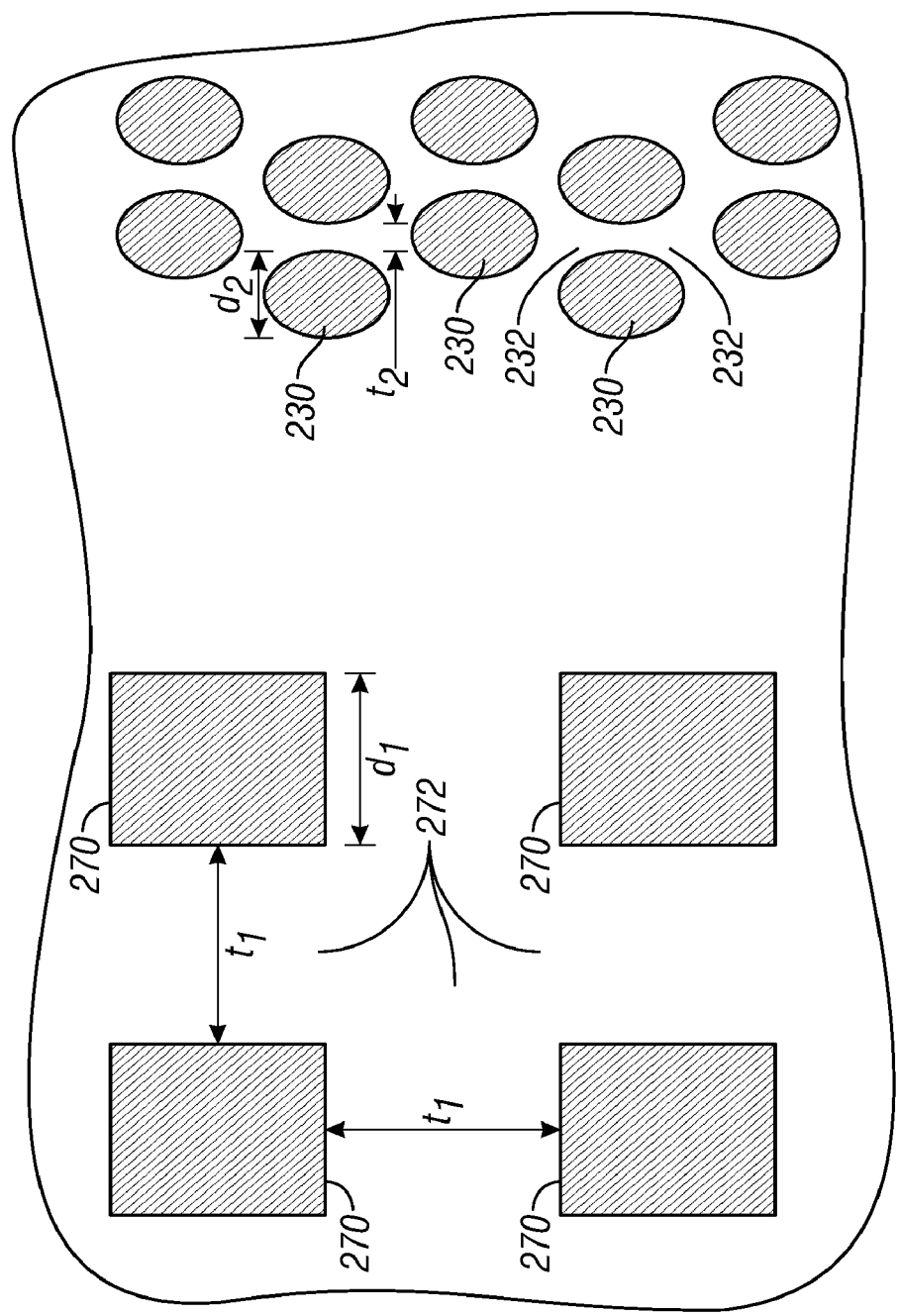
FIG. 5 is a top enlarged view of a portion of the disk according to this invention showing patterned servo pillars and servo trenches in a servo region and patterned data pillars and data trenches in a data region.

FIG. 5 is a top enlarged view of a portion of the disk according to this invention showing patterned servo pillars 270 and servo trenches 272 in a servo region and patterned data pillars 230 and data trenches 232 in a data region. The servo pillars 270 and data pillars 230 are all magnetized in the same perpendicular direction (into or out of the page in FIG. 5), the servo trenches 272 are magnetized in the opposite perpendicular direction, and the data trenches 232 have essentially no magnetization. The servo pillars 270 have a feature size or characteristic dimension (d1) parallel to the disk surface and the data pillars 230 have a feature size or characteristic dimension (d2) parallel to the disk surface. The characteristic dimension of a pillar is its largest dimension, for example the longest side of a rectangularly-shaped feature, the diameter of a circularly-shaped feature and the long axis of an elliptically-shaped feature. Similarly, the servo trenches 272 and data trenches 232 have feature sizes or characteristic dimensions t2 and t1, respectively. The characteristic dimension of a trench is its smallest distance between adjacent pillars. In FIG. 5, d1 is approximately equal to t1 and d2 is approximately equal to two times t2. Also, d1 is approximately three times d2. In one example of a disk according to the invention, d1 is about 100 nm, t1 is about 100 nm, d2 is about 30 nm and t2 is about 15 nm. With these dimensions of d2 and t2 for the data pillars 230, the disk would have an areal bit density of approximately 300 Gbits/in². In the disk of this invention the characteristic dimension for the servo trenches (t1) is preferably between 30 nm and 400 nm and the characteristic dimension for the data trenches (t2) is preferably between 2 nm and 20 nm (assuming a pillar height of about 30 nm for the pre-patterned substrates).

Figure 6A:
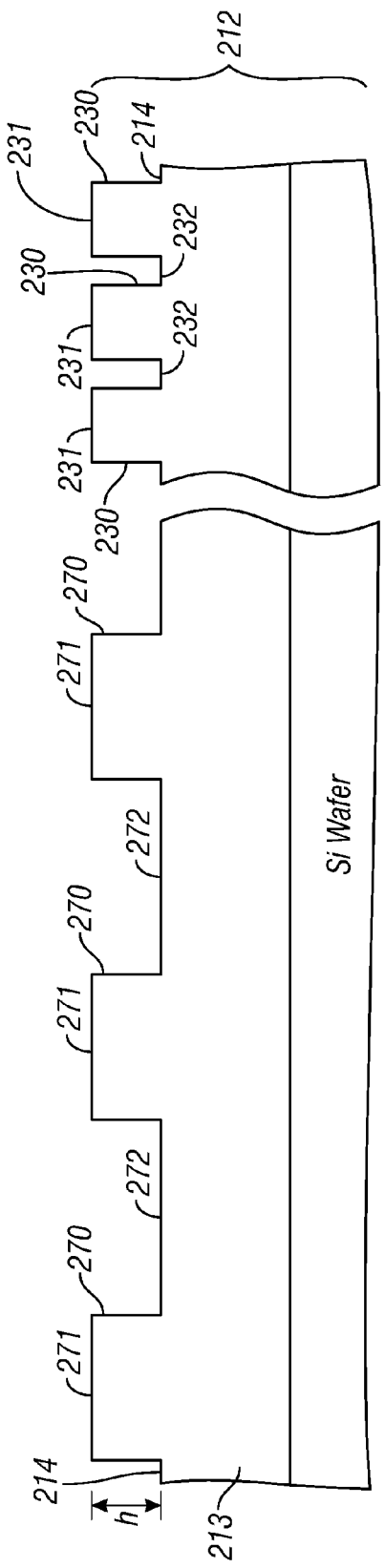

FIGS. 6A-6D are side sectional views of the portion of the disk shown in FIG. 5 at various stages of the manufacturing process. FIG. 6A shows a pre-etched substrate 212 with generally planar surface 214. The pre-etched substrate 212 can be fabricated by any of several methods, such as conventional lithography, direct-write electron-beam (e-beam) lithography, and nanoimprinting. These methods are well-known and described in detail in numerous references, including Moritz et al. in "Patterned Media Made From Pre-Etched Wafers: A Promising Route Toward Ultrahigh-Density Magnetic Recording", *IEEE Transactions on Magnetics*, Vol. 38, No. 4, July 2002, pp. 1731-1736; G. Hu, et al., "Magnetic and recording properties of Co/Pd islands on prepatterned substrates", *J. Appl. Phys.*, Vol. 95, No. 11, Part 2, 1 Jun. 2004, pp. 7013-7015; and Bandic et al., "Patterned magnetic media: impact of nanoscale patterning on hard disk drives", *Solid State Technology S7+Suppl. S*, September 2006. For example, the substrate may be a rigid silicon wafer, such as a semiconductor-grade single-crystal silicon wafer, onto which a layer 213 of silicon oxide such as $SiO_2$ is formed. The layer 213 is then patterned and etched, leaving data pillars 230 and servo pillars 270 extending from surface 214. The data pillars 230 and servo pillars 270 have a typical height (h) of approximately 5 to 50 nm and are depicted in FIG. 6A with a height of about 30 nm. The pillars 230, 270 have tops or ends 231, 271 respectively, that are generally coplanar. The spaces between the data pillars 230 at surface 214 are data trenches 232 and the spaces between servo pillars 270 at surface 214 are servo trenches 272. The pillars 230, 270 are thus formed of a silicon oxide such as $SiO_2$, but layer 213 may also be formed of other materials, such as a silicon nitride (SiN), diamond-like carbon (DLC), alumina ($Al_2O_3$), or refractory metals and their alloys, e.g., tungsten (W), molybdenum (Mo), niobium (Nb), tantalum (Ta), and rhenium (Re).

Figure 6B:
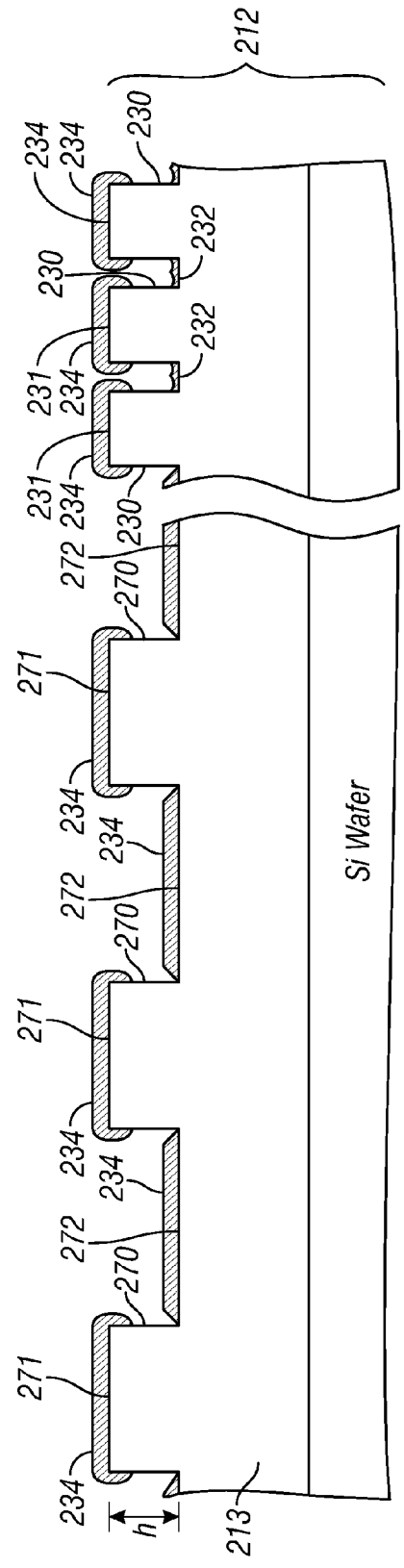

FIG. 6B is a sectional view of the substrate 212 after deposition of a multilayer 234 that serves as the magnetic recording layer. A protective overcoat (not shown), such as an amorphous "diamond-like" carbon film or a silicon-nitride film, may be formed on top of the multilayer 234. The deposition of multilayer 234 is typically by sputter deposition and results in the multilayer 234 being deposited on the ends 271, 231 of servo pillars 270 and data pillars 230, respectively, as well as in the servo trenches 272 and to a much lesser extent in data trenches 232. The multilayer 234 has perpendicular magnetic anisotropy and is a multilayer of alternating very thin (atomic-level thickness) films. These multilayers include a Co/Ni multilayer as well as a multilayer of alternating first and second films, i.e., ferromagnetic films (Co, Fe, CoFe, CoNi or FeNi) and metal films (Pt or Pd). In a typical example, 4-10 films of Pt (each approximately 0.3 to 1.5 nm thick) and 4-10 films of Co (each approximately 0.1 to 0.6 nm thick) are alternately deposited to form a Co/Pt multilayer. In one specific example the multilayer 234 is formed of 8 pairs of alternating 0.3 nm Co and 0.9 nm Pt films $[Co(0.3)/Pt(0.9)]_8$. The alternately-deposited Co and Pt films are sputter deposited at low sputtering pressure, typically between about 0.5 and 20 mTorr in an Argon (Ar) atmosphere. The low sputtering pressure is important to obtain highly exchange-coupled grains in the multilayer. Prior to the sputter deposition of the multilayer 234 it is common to deposit an adhesion layer (e.g., Cr or Ta) with thickness in the range of about 0.5 to 4 nm and an initial Pt layer with a thickness in the range of about 0.5 to 10 nm. The thickness of the resulting structures on the ends of servo pillars 270 and data pillars 230 is in the range of about 5 to 20 nm.

FIG. 6B shows that the multilayer 234 is only partially or incompletely deposited in the data trenches 232, so that the material in the trenches 232 is either essentially nonmagnetic or contains a significantly reduced and therefore disconnected amount of magnetic material compared to the servo trenches. This is because of the shadowing effect of the sidewalls of the data pillars 230 during the sputter deposition of the individual films of the multilayer. This shadowing effect will occur if the height of the data pillars is equal to or greater than the characteristic dimension of the data trenches, i.e., $h \geq t2$. In the example of FIG. 5 h=30 nm and t2=15 nm. In addition to shadowing from the sidewalls of the data pillars 230, as the films of multilayer 234 are formed on the ends of the data pillars 232, they grow in the horizontal direction, as depicted in FIG. 6B, which increases the effective horizontal dimension and thus further shadows the trenches and prevents the necessary amount of sputtered material from reaching the trenches. Because the multilayer 234 must be precisely formed of alternating atomic-level thickness individual films to exhibit the required perpendicular magnetic anisotropy, if one of the ferromagnetic films, e.g., Co in a Co/Pd multilayer, is not fully deposited to the required thickness, the structure will be essentially nonmagnetic (e.g., paramagnetic). The shadowing effect may also result in the formation of magnetic material in the data trenches, but the material is discontinuous and in a significantly reduced amount from what is formed in the servo trenches. Discontinuous magnetic material in the data trenches will have a high coercivity so that it cannot be rewritten when the write head is writing to the data pillars due to the increased spacing between the write head and data trenches. Also, the discontinuous magnetic material in the data trenches can be permanently magnetized at the same time as the servo pillars are magnetized by the application of the high DC magnetic field in the process described below, so that after the completion of the process the data trenches contain discontinuous material magnetized in the same direction as the magnetization of the servo pillars.

If the recording layer materials were the conventional granular cobalt-alloy material, rather than the multilayer used in this invention, it is not likely that the above-described shadowing effects would prevent the material in the trenches from still being magnetic. This is because if only a portion of the granular cobalt-alloy material were deposited in the trenches, even if the trenches were not fully covered, the material would still be magnetic and thus still contribute noise to the data readback signal. As can be appreciated from FIG. 6B these shadowing effects do not occur, or occur to an insignificant extent, in the servo trenches 272 because the height of the servo pillars 270 is substantially less than the characteristic dimension of the servo trenches 272, i.e., h=30 nm and t1=100 nm in the example of FIG. 5. To prevent shadowing in the servo trenches the height of the servo pillars should be less, and preferably substantially less, than the characteristic dimension of the servo trenches. For example, if h=30 nm, then t1 should be greater than 30 nm and preferably at least 60 nm.

FIG. 6C shows the structure after the application of a first DC magnetic field to the disk in one perpendicular direction (down or into the disk in FIG. 6C) with a field strength sufficient to saturate the multilayer 234. This results in the servo pillars 270, data pillars 230 and servo trenches 272 all being magnetized in the same direction, as represented by the arrows. If the multilayer 234 is the $[Co(0.3)/Pt(0.9)]_8$ multilayer and the servo pillar diameter (d1) is about 100 nm then a field greater than 6.5 kOe may be sufficient for the first DC magnetic field. If d1 is larger then a larger field will be required.

FIG. 6D shows the structure after the application of a second DC magnetic field to the disk in the opposite perpendicular direction (up or out of the disk in FIG. 6C) with a field strength significantly less than the strength of the first field. This field is sufficient to switch the magnetization direction in the servo trenches 272 but insufficient to switch the magnetization of the servo pillars 270 and data pillars 230, as shown by the change in direction of the arrows in the servo trenches 272 from the direction in FIG. 6C. Even though the multilayer on the ends of the servo pillars 270 and data pillars 230 is essentially the same structure as the multilayer in the servo trenches 272, it has been found that the entire trench material will switch its magnetization at a very low applied field. For example, a field of only about 1 kOe has been found sufficient to switch the magnetization of the $[Co(0.3)/Pt(0.9)]_8$ multilayer in the trenches 272, while a field of at least 6.5 kOe would be required to switch the magnetization direction of the $[Co(0.3)/Pt(0.9)]_8$ multilayer on the servo pillars 270 and data pillars 230.

The multilayer in the servo trenches is made up of small microcrystalline grains, with multiple adjacent grains forming magnetic domains. The materials in the individual domains are highly magnetically exchange coupled. As a result of the relatively large surface area of the trench, different portions or volumes of the multilayer will have different anisotropy fields. Thus, when an external field is applied nucleation can occur at a relatively low field on some volumes that have low anisotropy field. When the magnetization of these few volumes switches at a relatively low field, they will cause the remaining volumes in the trench to also switch by domain wall motion because the materials in the domains are magnetically highly exchange coupled. However, in the servo pillars the propagation of domain walls cannot exceed the edge of each pillar. Thus, while the magnetization of the servo trenches switches with the application of this second DC magnetic field of only 1 kOe, the magnetization of the servo pillars and data pillars is not switched.

Figure 7:
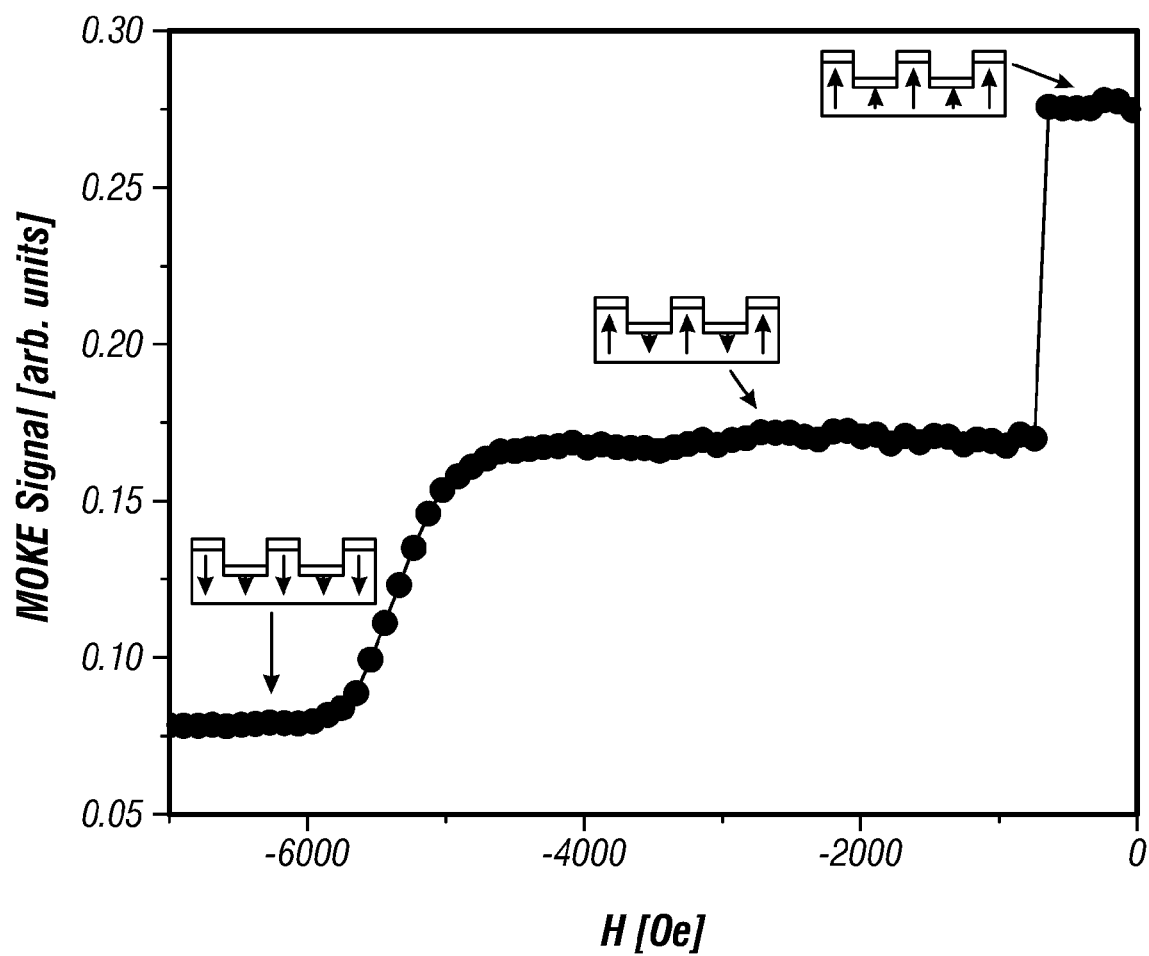
FIG. 7 is a graph of the magneto-optic Kerr effect (MOKE) measurement as a function of applied magnetic field (H) for a 100 micron×100 micron test coupon having a pattern of servo pillars and servo trenches with a [Co(0.3)/Pt(0.9)]$_8$ multilayer on the pillar ends and in the trenches.

FIG. 7 is a graph of a magneto-optic Kerr effect (MOKE) measurement as a function of applied magnetic field (H) for a 100 micron×100 micron test coupon having a pattern of servo pillars and servo trenches like in FIG. 5 with a [Co(0.3)/Pt (0.9)] multilayer on the pillar ends and in the trenches. At zero applied field (H=0) the coupon has been saturated with a perpendicular field greater than 6500 Oe and the pillars and trenches are magnetized in the same direction. At H=−1000 Oe, the magnetization of the trenches has reversed but the magnetization of the pillars has not. This magnetization state remains stable until about H=−5000 Oe when the magnetization of the pillars begins to reverse. At about H=−6500 Oe the magnetization of essentially all of the pillars has reversed. Thus in FIG. 7, the magnetization state at H=0 applied field corresponds to the state after the application of the first DC magnetic field (FIG. 6C), and the magnetization state at H=−1000 Oe corresponds to the state after application of the second DC magnetic field (FIG. 6D) in the opposite direction and at a field strength substantially less than the strength of the first field (1000 Oe vs. 6500 Oe). Thus FIG. 7 shows that the magnetization in the servo trenches can be reliably reversed without reversing the magnetization of the pillars because of the sudden reversal at 1000 Oe and the wide margin between 1000 Oe and about 5000 Oe where no reversal of the servo pillars will occur.

In the invention described above the recording layer material deposited over the substrate is a multilayer like Co/Pt or Co/Pd. However, the recording layer material can also be one of the well-known chemically-ordered binary alloys CoPt, CoPd, FePt, FePd, $CoPt_3$, $Co_3Pt$, $CoPd_3$ and $Co_3Pd$ or pseudo-binary alloys based on the CoPt and FePt $L1_0$ phase. Chemically-ordered alloys of CoPt, CoPd, FePt and FePd (all ordered in $L1_0$) and $CoPt_3$, $Co_3Pt$ and $CoPd_3$ (all ordered in $L1_2$) in their bulk form, are known for their high magneto-crystalline anisotropy and magnetic moment, properties that are desirable for high-density magnetic recording materials. Pseudo-binary alloys based on the CoPt and FePt $L1_0$ phase, e.g., $(Co_{(y)}Pt_{(100-y)})$—X and $(Fe_{(y)}Pt_{(100-y)})$—X, where y is between about 45 and 55 atomic percent and the element X may be Ni, Au, Cu, Pd or Ag and is present in the range of between about 0% to about 20% atomic percent, are also suitable high anisotropy materials. While the pseudo-binary alloys in general have similarly high anisotropy as the binary alloys FePt and CoPt, they allow additional control over the magnetic and structural properties of the media. These types of binary and pseudo-binary alloys in the servo trenches will behave like the multilayers in the servo trenches when exposed to a low DC magnetic field, i.e., some volumes will switch at the low field and will cause the remaining volumes in the servo trenches to also switch by domain wall motion because the materials are magnetically highly exchange coupled.

It is preferable that these binary and pseudo-binary alloys be perfectly ordered because this will result in the highest perpendicular magnetic anisotropy. However, as a practical matter it is not always possible to achieve perfect chemical ordering (ordering parameter of 1) or even partial chemical ordering during the film formation process. Nevertheless such alloys are still useful in this invention because they may still have high anisotropy and still show the behavior of magnetization reversal in the servo trenches at low DC magnetic field. To achieve some level of chemical ordering it is important that the elements in these alloys be generally in the correct proportion. For example, in a CoPt binary alloy the atomic percent of Co should be between about 45 to 55 percent, and in a $CoPt_3$ alloy the atomic percent of Co should be between about 20 to 30 percent. Films with these alloys can be made by several known processes. Films having the $L1_0$ phase of FePt with the c-axis oriented out-of-plane or perpendicular to the substrate, and thus suitable for perpendicular magnetic recording media, have been grown onto a hot substrate by molecular beam epitaxy and by sputter deposition. They can also be formed by alternating the deposition of films of Fe and Pt, followed by annealing, the latter approach being described in U.S. Pat. No. 5,363,794. In the preferred method for making the films, for example a chemically-ordered $Co_{50}Pt_{50}$ binary alloy film, a high degree of chemical ordering is usually achieved by deposition at high temperature, which is usually above 300 degrees Celsius (deg C), often 600-1000 deg C. Alternatively, one can use room temperature (RT) deposition and subsequent high temperature post-annealing or rapid thermal annealing (RTA). Another possibility is ion irradiation during low temperature growth (RT about 300 deg C.). For high volume production processes high temperatures are often not possible or not practical or too expensive and thus perfect or close to perfect ordering is usually not achieved. Moreover, for the specific application in combination with pre-patterned substrates one has to make sure that the pre-patterned substrates survive the high temperatures without significant damage. Therefore short post-annealing procedures such as used in RTA are probably most suitable. Alternatively, ion irradiation assisted growth may be another way of obtaining a high degree of chemical ordering when depositing the above-listed materials on pre-patterned substrates.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a patterned-media perpendicular magnetic recording disk comprising:

providing a substrate having a generally planar surface and a plurality of data pillars and a plurality of nondata servo pillars extending generally perpendicularly from said substrate surface, the data pillars arranged in generally concentric circular tracks and spaced-apart to define data trenches at said substrate surface between the data pillars, the height of the data pillars above the substrate surface being greater than or equal to the spacing between the data pillars on the substrate surface, the nondata servo pillars arranged in angularly-spaced nondata servo sectors extending generally radially across the tracks and spaced apart to define servo trenches at said substrate surface between the servo pillars, the spacing between the servo pillars on the substrate surface being greater than the height of the servo pillars above the substrate surface;

sputter depositing on the substrate surface magnetizable material selected from the group consisting of (a) a multilayer of alternating layers of a first material and a second material, said first material/second material multilayer selected from the group consisting of Co/Ni, Co/Pt, Co/Pd, Fe/Pt, Fe/Pd, CoFe/Pt, CoFe/Pd, CoNi/Pt, CoNi/Pd, FeNi/Pt and FeNi/Pd, said multilayer having perpendicular magnetic anisotropy, (b) a binary alloy selected from CoPt, CoPd, FePt, FePd, $CoPt_3$, $Co_3Pt$, $CoPd_3$ and $Co_3Pd$, and (c) an alloy selected from $(Co_{(y)}$ $Pt_{(100-y)})$—X and $(Fe_{(y)}Pt_{(100-y)})$—X, where y is between about 45 and 55 atomic percent and the element X is selected from the group consisting of Ni, Au, Cu, Pd and Ag and is present in an amount greater than zero atomic percent and less than or equal to 20 atomic percent;

applying a first magnetic field in a first direction perpendicular to the substrate surface to magnetize said multilayer on the data pillars and servo pillars and in the servo trenches in the same perpendicular direction; and applying a second magnetic field less than the first magnetic field in a second direction perpendicular to the substrate surface and opposite said first direction to reverse the magnetization of said multilayer in the servo trenches without reversing the magnetization of said multilayer on the data pillars and servo pillars.

2. The method of claim 1 wherein providing a substrate having servo pillars spaced apart to define servo trenches comprises providing a substrate with the spacing between servo pillars being greater than twice the height of the servo pillars above the substrate surface.

3. The method of claim 1 wherein sputter depositing the multilayer comprises sputter depositing the alternating films in a Argon atmosphere at a sputtering pressure less than 20 mTorr.

4. The method of claim 1 wherein applying a first magnetic field comprises applying a magnetic field greater than 6000 Oe.

5. The method of claim 1 wherein applying a second magnetic field comprises applying a magnetic field greater than 1000 Oe and less than 5000 Oe.

* * * * *